(12) United States Patent
Yi et al.

(10) Patent No.: US 12,294,131 B2
(45) Date of Patent: May 6, 2025

(54) MULTILAYERED FILTER DEVICE

(71) Applicant: TDK CORPORATION, Tokyo (JP)

(72) Inventors: Longfei Yi, Tokyo (JP); Shigemitsu Tomaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 339 days.

(21) Appl. No.: 17/968,214

(22) Filed: Oct. 18, 2022

(65) Prior Publication Data

US 2023/0130049 A1 Apr. 27, 2023

(30) Foreign Application Priority Data

Oct. 26, 2021 (JP) .................................. 2021-174637

(51) Int. Cl.
| | | |
|---|---|---|
| *H01P 1/203* | (2006.01) | |
| *H01P 1/20* | (2006.01) | |
| *H01P 7/08* | (2006.01) | |
| *H03H 7/01* | (2006.01) | |
| *H03H 1/00* | (2006.01) | |

(52) U.S. Cl.
CPC ............ *H01P 1/20345* (2013.01); *H01P 1/20* (2013.01); *H01P 7/08* (2013.01); *H01P 7/082* (2013.01); *H03H 7/0115* (2013.01); *H03H 2001/0085* (2013.01)

(58) Field of Classification Search
CPC ........ H01P 1/20; H01P 7/082; H01P 1/20345; H01P 7/08; H03H 7/0115; H03H 2001/0085

USPC ................................ 333/175, 185, 204, 205
See application file for complete search history.

(56) References Cited

U.S. PATENT DOCUMENTS

| | | | | |
|---|---|---|---|---|
| 6,020,799 A | * | 2/2000 | Ishizaki ................ | H01P 1/2135 333/204 |
| 7,432,786 B2 | * | 10/2008 | Tomaki ............... | H01P 1/20345 333/204 |
| 7,468,643 B2 | * | 12/2008 | Ninomiya ........... | H01P 1/20345 333/204 |
| 8,130,061 B2 | * | 3/2012 | Fukunaga ........... | H01P 1/20336 333/204 |
| 10,658,720 B2 | * | 5/2020 | Ashida ..................... | H03H 1/00 |
| 2014/0232482 A1 | | 8/2014 | Wada et al. | |
| 2020/0303798 A1 | * | 9/2020 | Ashida .................... | H01P 1/203 |

FOREIGN PATENT DOCUMENTS

| | | | | |
|---|---|---|---|---|
| CN | 104393382 A | * | 3/2015 | |
| CN | 206697588 U | * | 12/2017 | |
| JP | 2007072590 A | * | 3/2007 | |
| WO | WO-2021106442 A1 | * | 6/2021 | ............. H01P 1/203 |

* cited by examiner

*Primary Examiner* — Rakesh B Patel
(74) *Attorney, Agent, or Firm* — Oliff PLC

(57) ABSTRACT

A filter device includes first to third resonators. Each of the first to third resonators includes a first line part and a second line part electrically connected to the first line part and having an impedance smaller than an impedance of the first line part. The impedance ratio in at least one of the first to third resonators is 0.3 or smaller. The shape of each of the second line part of the first resonator and the second line part of the second resonator is long in a direction orthogonal to a stacking direction and crossing the longitudinal direction of the second line part of the third resonator.

10 Claims, 14 Drawing Sheets

MULTILAYERED FILTER DEVICE

BACKGROUND OF THE INVENTION

1. Field of the Invention

The present invention relates to a multilayered filter device including a resonator constituted of a distributed constant line.

2. Description of the Related Art

One of electronic components used in a communication apparatus is a band-pass filter including a plurality of resonators. Each of the plurality of resonators is constituted of, for example, a distributed constant line. The distributed constant line is configured to have a predetermined line length.

Miniaturization of band-pass filters used in small-sized communication apparatuses, in particular, has been desired. However, in a case of a band-pass filter including a resonator formed of a distributed constant line, it is difficult to realize miniaturization of the band-pass filter due to the distributed constant line constituting the resonator.

US 2014/0232482 A1 describes a both-end short-circuited type stepped-impedance transmission line resonator (also referred to as a stepped-impedance resonator (SIR)). In the technique described in US 2014/0232482 A1, the ratio (hereinafter also referred to as an impedance ratio) of the line impedance of a transmission line having a relatively large width to the line impedance of a transmission line having a relatively small width is set to be smaller than 1, to thereby miniaturize the size of the resonator.

To further miniaturize a band-pass filter including an SIR, it is conceivable to make the impedance ratio even smaller to thereby reduce the size of the resonator. However, it is found that, in a conventional band-pass filter, such a method results in generating many spurious components in a frequency region higher than a passband.

SUMMARY OF THE INVENTION

An object of the present invention is to provide a multilayered filter device that can be miniaturized while reducing generation of spurious.

A multilayered filter device according to the present invention includes a stack including a plurality of dielectric layers stacked together, and a first resonator, a second resonator, and a third resonator integrated with the stack. The stack includes a first side surface and a second side surface located at both ends in a direction orthogonal to a stacking direction of the plurality of dielectric layers. The first resonator is arranged at a position closer to the first side surface than the second side surface. The second resonator is arranged at a position closer to the second side surface than the first side surface. At least part of the third resonator is arranged between the first resonator and the second resonator when seen in a direction parallel to the stacking direction.

Each of the first resonator, the second resonator, and the third resonator includes a first line part and a second line part having an impedance smaller than an impedance of the first line part. An impedance ratio being a ratio of an impedance of the second line part to an impedance of the first line part in at least one of the first resonator, the second resonator, and the third resonator is 0.3 or smaller.

A shape of the second line part of the third resonator is long in a direction orthogonal to the stacking direction. A shape of each of the second line part of the first resonator and the second line part of the second resonator is long in a direction orthogonal to the stacking direction and crossing a longitudinal direction of the second line part of the third resonator.

In the multilayered filter device according to the present invention, the impedance ratio in each of the first resonator, the second resonator, and the third resonator may be 0.3 or smaller.

In the multilayered filter device according to the present invention, a longitudinal direction of the second line part of the first resonator and a longitudinal direction of the second line part of the second resonator may be orthogonal to the longitudinal direction of the second line part of the third resonator.

In the multilayered filter device according to the present invention, each of the first line part of the first resonator and the first line part of the second resonator may include portions extending in a plurality of directions that are orthogonal to the stacking direction and are different from each other.

In the multilayered filter device according to the present invention, the first line part of the third resonator may have an asymmetrical shape.

The multilayered filter device according to the present invention may further include a first stub resonator electrically connected to the first line part of the first resonator, and a second stub resonator electrically connected to the first line part of the second resonator.

In the multilayered filter device according to the present invention, the third resonator may be arranged between the first resonator and the second resonator in a circuit configuration.

In the multilayered filter device according to the present invention, the first line part and the second line part may be located at positions different from each other in the stacking direction and electrically connected to each other in each of the first resonator, the second resonator, and the third resonator.

The multilayered filter device according to the present invention may further include a plurality of through holes connecting the first line part and the second line part of each of the first resonator, the second resonator, and the third resonator.

In the multilayered filter device according to the present invention, the first line part of the first resonator and the first line part of the second resonator may be arranged at a same position in the stacking direction. The first line part of the third resonator may be arranged at a position different from a position of the first line part of each of the first resonator and the second resonator in the stacking direction.

In the multilayered filter device according to the present invention, the second line part of the first resonator and the second line part of the second resonator may be arranged at a same position in the stacking direction. The second line part of the third resonator may be arranged at a position different from a position of the second line part of each of the first resonator and the second resonator in the stacking direction.

In the multilayered filter device according to the present invention, the impedance ratio in at least one of the first resonator, the second resonator, and the third resonator is 0.3 or smaller. Each of the shape of the second line part of the first resonator and the shape of the second line part of the second resonator is long in a direction orthogonal to the stacking direction, and the shape of the second line part of the third resonator is long in a direction orthogonal to the stacking direction and crossing the longitudinal direction of the second line part of the first resonator and the longitudinal direction of the second line part of the second resonator. In view of these, according to the present invention, it is possible to provide a multilayered filter device that can be miniaturized while reducing generation of spurious.

Other and further objects, features and advantages of the present invention will appear more fully from the following description.

DETAILED DESCRIPTION OF THE PREFERRED EMBODIMENTS

First Embodiment

Figure 1:
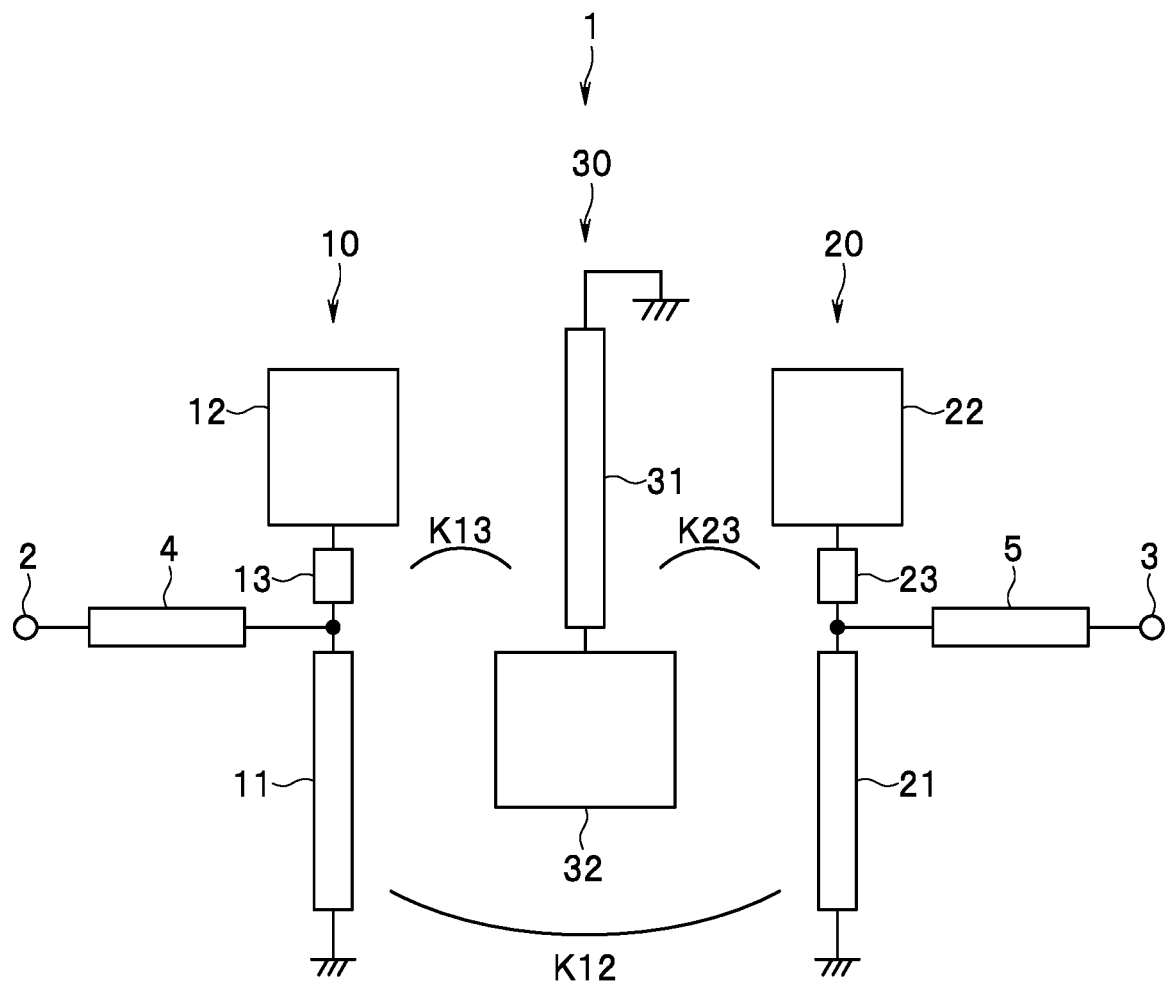
FIG. 1 is a circuit diagram showing a circuit configuration of a multilayered filter device according to a first embodiment of the present invention.

Embodiments of the present invention will now be described in detail with reference to the drawings. First, reference is made to FIG. 1 to describe a configuration of a multilayered filter device (hereinafter referred to simply as a filter device) 1 according to a first embodiment of the present invention. FIG. 1 is a circuit diagram showing a circuit configuration of the filter device 1. The filter device 1 is configured to function as a band-pass filter that selectively allows a signal of a frequency in a predetermined passband to pass.

The filter device 1 according to the present embodiment includes a first resonator 10, a second resonator 20, and a third resonator 30 arranged between the first resonator 10 and the second resonator 20 in a circuit configuration. In the present application, the expression of "in the (a) circuit configuration" is used not to indicate a layout in physical configuration but to indicate a layout in the circuit diagram.

The first to third resonators 10, 20, and 30 are configured so that the first resonator 10 and the third resonator 30 are adjacent to each other in the circuit configuration to be electromagnetically coupled to each other, and the second resonator 20 and the third resonator 30 are adjacent to each other in the circuit configuration to be electromagnetically coupled to each other. In FIG. 1, a curve with a sign K13 represents an electric field coupling between the first resonator 10 and the third resonator 30, and a curve with a sign K23 represents an electric field coupling between the second resonator 20 and the third resonator 30.

The first resonator 10 is magnetically coupled to the second resonator 20 not adjacent to the first resonator 10 in the circuit configuration. Such electromagnetic-field coupling between two resonators not adjacent to each other in the circuit configuration is referred to as cross coupling. In FIG. 1, a curve with a sign K12 represents a magnetic field coupling between the first resonator 10 and the second resonator 20.

The first resonator 10 includes a first line part 11 and a second line part 12 having an impedance smaller than that of the first line part 11. The first line part 11 and the second line part 12 are electrically connected to each other. The first line part 11 is connected to ground. Each of the first line part 11 and the second line part 12 is a distributed constant line. In particular, in the present embodiment, the first line part 11 is a distributed constant line having a small width, and the second line part 12 is a distributed constant line having a width larger than that of the first line part 11.

The first resonator 10 further includes a conductor part 13 electrically connecting the first line part 11 and the second line part 12. The conductor part 13 may include a distributed constant line having a width smaller than that of the second line part 12. The width of the distributed constant line of the conductor part 13 may be the same as or different from the width of the first line part 11.

A configuration of the second resonator 20 is basically the same as the configuration of the first resonator 10. Specifically, the second resonator 20 includes a first line part 21 and a second line part 22 having an impedance smaller than that of the first line part 21. The first line part 21 and the second line part 22 are electrically connected to each other. The first line part 21 is connected to ground. Each of the first line part 21 and the second line part 22 is a distributed constant line. In particular, in the present embodiment, the first line part 21 is a distributed constant line having a small width, and the second line part 22 is a distributed constant line having a width larger than that of the first line part 21.

The second resonator 20 further includes a conductor part 23 electrically connecting the first line part 21 and the second line part 22. The conductor part 23 may include a distributed constant line having a width smaller than that of the second line part 22. The width of the distributed constant line of the conductor part 23 may be the same as or different from the width of the first line part 21.

The third resonator 30 includes a first line part 31 and a second line part 32 having an impedance smaller than that of the first line part 31. The first line part 31 and the second line part 32 are electrically connected to each other. The first line part 31 is connected to ground. Each of the first line part 31 and the second line part 32 is a distributed constant line. In particular, in the present embodiment, the first line part 31 is a distributed constant line having a small width, and the second line part 32 is a distributed constant line having a width larger than that of the first line part 31.

All the first to third resonators 10, 20, and 30 are each a stepped-impedance resonator composed of a distributed constant line having a small width and a distributed constant line having a large width. All the first to third resonators 10, 20, and 30 are each a quarter-wavelength resonator with one end being short-circuited and the other end being open.

The impedance of each of the first line parts 11, 21, and 31 is within a range from 15Ω to 35Ω, for example. The impedance of each of the second line parts 12, 22, and 32 is within a range from 1Ω to 5Ω, for example. Here, the ratio of the impedance of the second line part to the impedance of the first line part in each of the first to third resonators 10, 20, and 30 is referred to as an impedance ratio. From the viewpoint of making the resonators smaller, the impedance ratio is preferably small. For example, by adjusting the widths of the first line part and the second line part, the impedance ratio can be adjusted. For a smaller impedance ratio, the width of the first line part is relatively small, and the width of the second line part is relatively large.

In the present embodiment, the impedance ratio in at least one of the first to third resonators 10, 20, and 30 is 0.3 or smaller. It is given, in particular, in the present embodiment, that the impedance ratio in each of the first to third resonators 10, 20, and 30 is 0.3 or smaller. In one example, the impedance of the second line part of each of the first and second resonators 10 and 20 is 2.87Ω, and the impedance of the first line part of each of the first and second resonators 10 and 20 is 27Ω. In this case, the impedance ratio in each of the first and second resonators 10 and 20 is assumed to be 0.106. In one example, the impedance of the second line part 32 of the third resonator 30 is 2.55Ω, and the impedance of the first line part 31 of the third resonator 30 is 27Ω. In this case, the impedance ratio in the third resonator 30 is 0.094.

When the impedance ratio is made too small, desired characteristics are not obtained in some cases. For example, when the impedance ratio is made too small in a stepped-impedance resonator (quarter-wavelength resonator) with one end being short-circuited and the other end being open, this resonator serves as a half-wavelength resonator substantially composed only of a second line part with both ends being open. Consequently, desired characteristics cannot be obtained. To prevent this, it is given, in the present embodiment, that the impedance ratio in each of the first to third resonators 10, 20, and 30 is 0.06 or larger.

The filter device 1 further includes a first port 2, a second port 3, and conductor portions 4 and 5. The first to third resonators 10, 20, and 30 are arranged between the first port 2 and the second port 3 in the circuit configuration.

The conductor portion 4 electrically connects the first port 2 and the first resonator 10. The conductor portion 4 is connected, at one end thereof, to the first port 2. The conductor portion 4 is connected, at the other end thereof, to the first resonator 10 between the first line part 11 and the conductor part 13.

The conductor portion 5 electrically connects the second port 3 and the second resonator 20. The conductor portion 5 is connected, at one end thereof, to the second port 3. The conductor portion 5 is connected, at the other end thereof, to the second resonator 20 between the first line part 21 and the conductor part 23.

Figure 2:
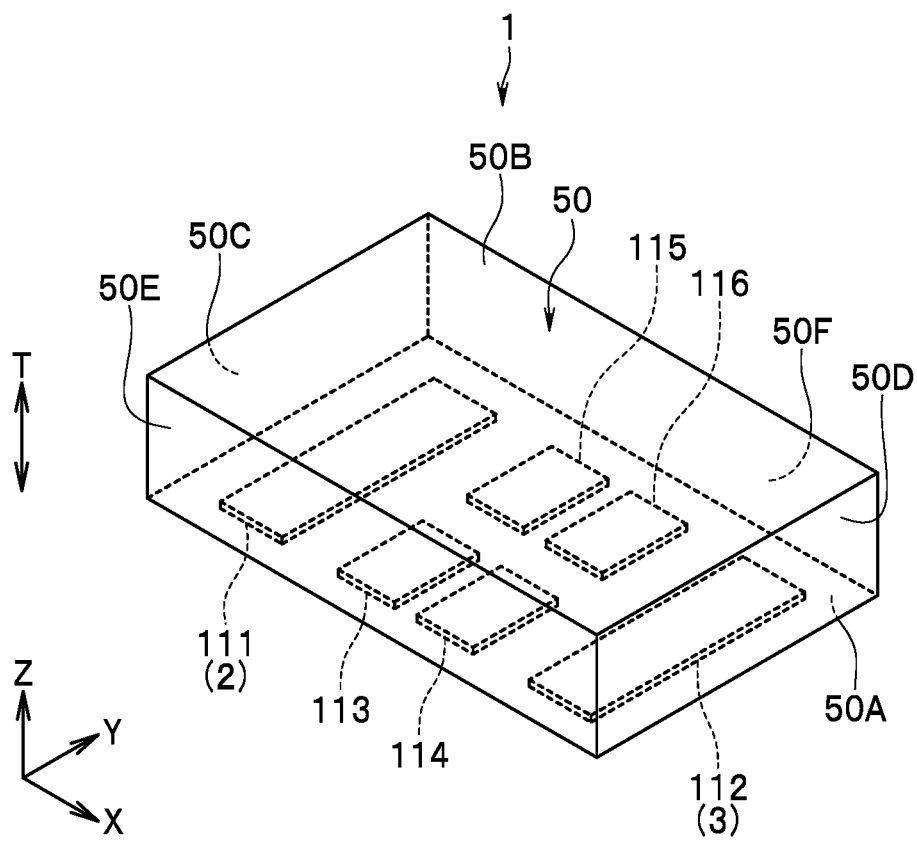
FIG. 2 is a perspective view showing an external appearance of the multilayered filter device according to the first embodiment of the present invention.

Next, other configurations of the filter device 1 will be described with reference to FIG. 2. FIG. 2 is a perspective view showing an outside view of the filter device 1.

The filter device 1 further includes a stack 50. The stack 50 includes a plurality of dielectric layers stacked together and a plurality of conductor layers and a plurality of through holes formed in the plurality of dielectric layers. The first to third resonators 10, 20, and 30 are integrated with the stack 50. The first to third resonators 10, 20, and 30 are formed by using the plurality of conductor layers.

The stack 50 has a first surface 50A and a second surface 50B located at both ends in a stacking direction T of the plurality of dielectric layers, and four side surfaces 50C to 50F connecting the first surface 50A and the second surface 50B. The side surfaces 50C and 50D are opposite to each other. The side surfaces 50E and 50F are opposite to each other. The side surfaces 50C to 50F are perpendicular to the first surface 50A and the second surface 50B.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively.

As shown in FIG. 2, the first surface 50A is located at the end of the stack 50 in the −Z direction. The first surface 50A is also the bottom surface of the stack 50. The second surface 50B is located at the end of the stack 50 in the Z direction. The second surface 50B is also the top surface of the stack 50. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The plane shape of the stack 50 when seen in the Z direction, i.e., the shape of the first surface 50A or the second surface 50B, is long in one direction. In particular, in the present embodiment, the plane shape of the stack 50 when seen in the Z direction is a rectangular shape that is long in a direction parallel to the X direction.

The filter device 1 further includes a plurality of terminals 111, 112, 113, 114, 115, and 116 provided on the first surface 50A of the stack 50. The terminal 111 extends in the Y direction near the side surface 50C. The terminal 112 extends in the Y direction near the side surface 50D. The terminals 113 to 116 are arranged between the terminal 111 and the terminal 112. The terminals 113 and 114 are arranged in this order near the side surface 50E in the X direction. The terminals 115 and 116 are arranged in this order near the side surface 50F in the X direction.

The terminal 111 corresponds to the first port 2, and the terminal 112 corresponds to the second port 3. Thus, the first and second ports 2 and 3 are provided on the first surface 50A of the stack 50. The terminals 113 to 116 are connected to ground. Hereinafter, the terminal 111 is also referred to as a first terminal 111, the terminal 112 is also referred to as a second terminal 112, and the terminals 113 to 116 are also referred to as ground terminals 113 to 116.

Next, an example of the plurality of dielectric layers and the plurality of conductor layers constituting the stack 50 will be described with reference to FIG. 3A to FIG. 5C. In this example, the stack 50 includes nine dielectric layers stacked together. The nine dielectric layers will be referred to as a first to a ninth dielectric layer in the order from bottom to top. The first to ninth dielectric layers are denoted by reference numerals 51 to 59, respectively.

Figure 3A:
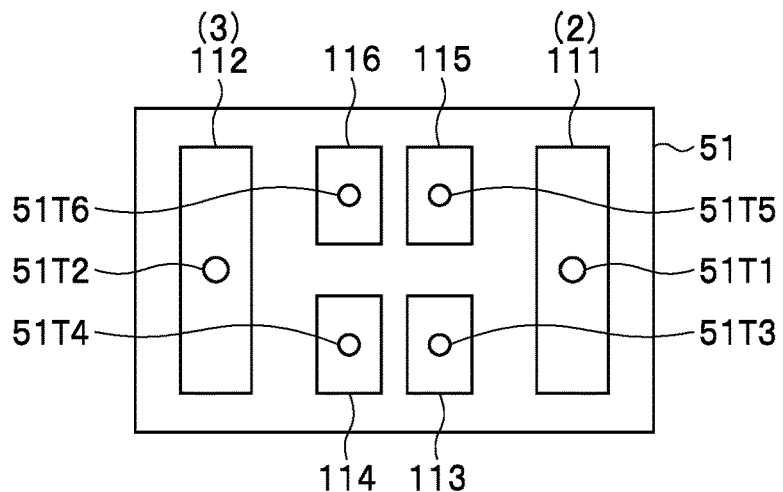
FIG. 3A to FIG. 3C are explanatory diagrams showing respective patterned surfaces of a first to a third dielectric layer of a stack of the multilayered filter device according to the first embodiment of the present invention.

FIG. 3A shows the patterned surface of the first dielectric layer 51. The terminals 111, 112, 113, 114, 115, and 116 are formed on the patterned surface of the dielectric layer 51. Through holes 51T1, 51T2, 51T3, 51T4, 51T5, and 51T6 connected respectively to the terminals 111, 112, 113, 114, 115, and 116 are formed in the dielectric layer 51.

Figure 3B:
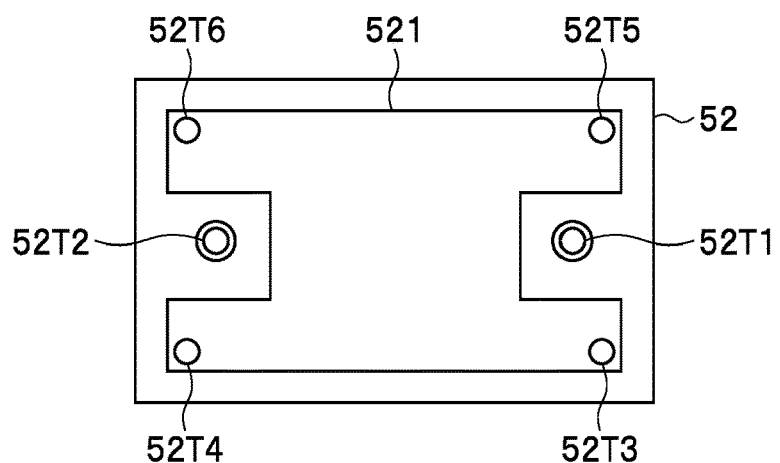

FIG. 3B shows the patterned surface of the second dielectric layer 52. A conductor layer 521 is formed on the patterned surface of the dielectric layer 52. Further, through holes 52T1, 52T2, 52T3, 52T4, 52T5, and 52T6 are formed in the dielectric layer 52. The through holes 51T1 and 51T2 formed in the dielectric layer 51 are connected to the through holes 52T1 and 52T2, respectively. The through holes 51T3 to 51T6 formed in the dielectric layer 51 and the through holes 52T3 to 52T6 are connected to the conductor layer 521.

Figure 3C:
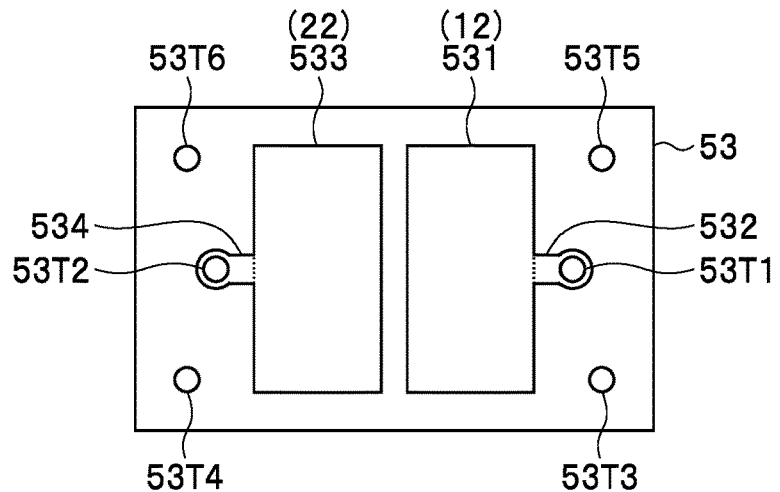

FIG. 3C shows the patterned surface of the third dielectric layer 53. Conductor layers 531, 532, 533, and 534 are formed on the patterned surface of the dielectric layer 53. The conductor layer 532 is connected to the conductor layer 531. The conductor layer 534 is connected to the conductor layer 533. In FIG. 3C, each of the boundary between the conductor layer 531 and the conductor layer 532 and the boundary between the conductor layer 533 and the conductor layer 534 is indicated by a dotted line.

Through holes 53T1, 53T2, 53T3, 53T4, 53T5, and 53T6 are formed in the dielectric layer 53. The through hole 52T1 formed in the dielectric layer 52 and the through hole 53T1 are connected to the conductor layer 532. The through hole 52T2 formed in the dielectric layer 52 and the through hole 53T2 are connected to the conductor layer 534. The through holes 52T3 to 52T6 formed in the dielectric layer 52 are connected to the through holes 53T3 to 53T6, respectively.

Figure 4A:
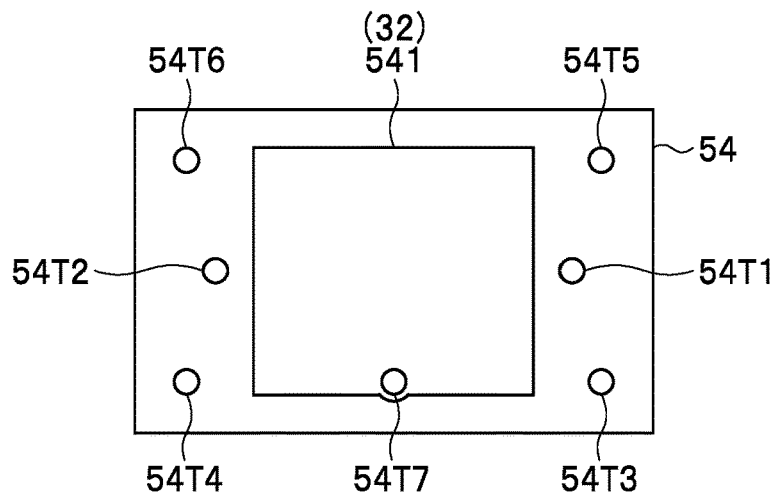
FIG. 4A to FIG. 4C are explanatory diagrams showing respective patterned surfaces of a fourth to a sixth dielectric layer of the stack of the multilayered filter device according to the first embodiment of the present invention.

FIG. 4A shows the patterned surface of the fourth dielectric layer 54. A conductor layer 541 is formed on the patterned surface of the dielectric layer 54. Through holes 54T1, 54T2, 54T3, 54T4, 54T5, 54T6, and 54T7 are formed in the dielectric layer 54. The through holes 53T1 to 53T6 formed in the dielectric layer 53 are connected to the through holes 54T1 to 54T6, respectively. The through hole 54T7 is connected to the conductor layer 541.

Figure 4B:
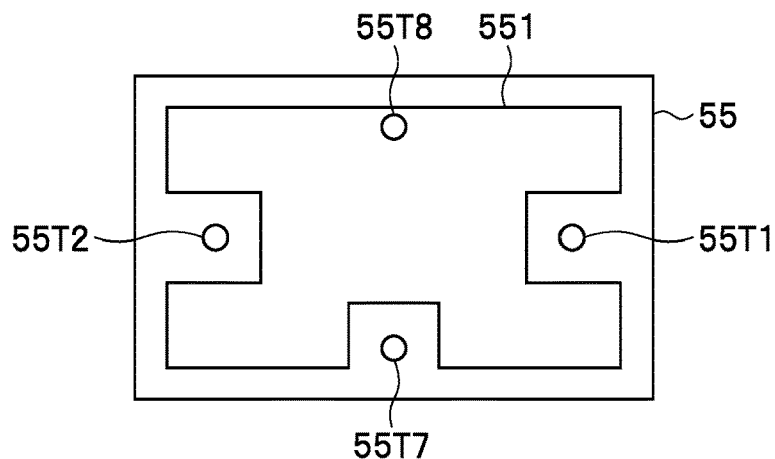

FIG. 4B shows the patterned surface of the fifth dielectric layer 55. A conductor layer 551 is formed on the patterned surface of the dielectric layer 55. Through holes 55T1, 55T2, 55T7, and 55T8 are formed in the dielectric layer 55. The through holes 54T1, 54T2, and 54T7 formed in the dielectric layer 54 are connected to the through holes 55T1, 55T2, and 55T7, respectively. The through holes 54T3 to 54T6 formed in the dielectric layer 54 and the through hole 55T8 are connected to the conductor layer 551.

Figure 4C:
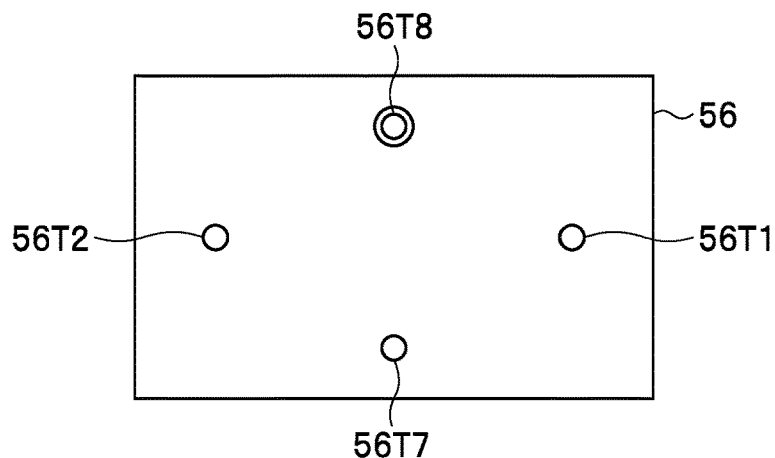

FIG. 4C shows the patterned surface of the sixth dielectric layer 56. Through holes 56T1, 56T2, 56T7, and 56T8 are formed in the dielectric layer 56. The through holes 55T1, 55T2, 55T7, and 55T8 formed in the dielectric layer 55 are connected to the through holes 56T1, 56T2, 56T7, and 56T8, respectively.

Figure 5A:
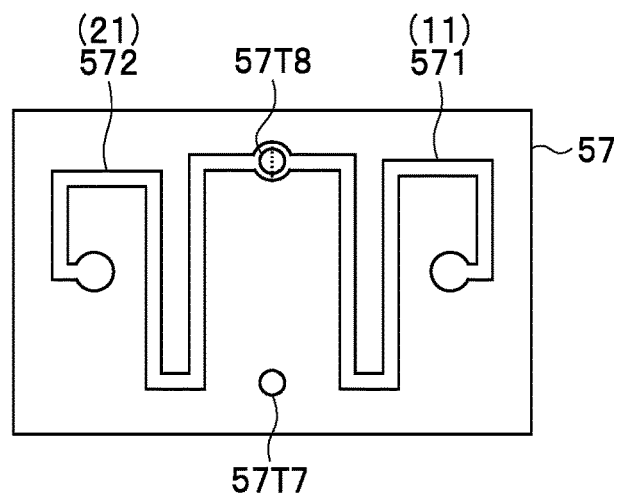
FIG. 5A to FIG. 5C are explanatory diagrams showing respective patterned surfaces of a seventh to a ninth dielectric layer of the stack of the multilayered filter device according to the first embodiment of the present invention.

FIG. 5A shows the patterned surface of the seventh dielectric layer 57. Conductor layers 571 and 572 are formed on the patterned surface of the dielectric layer 57. Each of the conductor layers 571 and 572 has a first end and a second end opposite to each other. The first end of the conductor layer 571 and the first end of the conductor layer 572 are connected to each other. In FIG. 5A, the boundary between the conductor layer 571 and the conductor layer 572 is indicated by a dotted line. The through hole 56T1 formed in the dielectric layer 56 is connected to a portion near the second end of the conductor layer 571. The through hole 56T2 formed in the dielectric layer 56 is connected to a portion near the second end of the conductor layer 572.

Through holes 57T7 and 57T8 are formed in the dielectric layer 57. The through hole 56T7 formed in the dielectric layer 56 is connected to the through hole 57T7. The through hole 56T8 formed in the dielectric layer 56 and the through hole 57T8 are connected to a portion near the first end of the conductor layer 571 and a portion near the first end of the conductor layer 572.

Figure 5B:
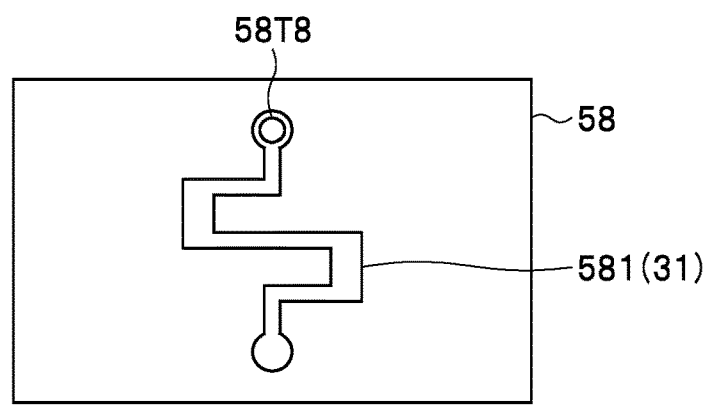

FIG. 5B shows the patterned surface of the eighth dielectric layer 58. A conductor layer 581 is formed on the patterned surface of the dielectric layer 58. The conductor layer 581 has a first end and a second end opposite to each other. The through hole 57T7 formed in the dielectric layer 57 is connected to a portion near the first end of the conductor layer 581.

A through hole 58T8 is formed in the dielectric layer 58. The through hole 57T8 formed in the dielectric layer 57 and the through hole 58T8 are connected to a portion near the second end of the conductor layer 581.

Figure 5C:
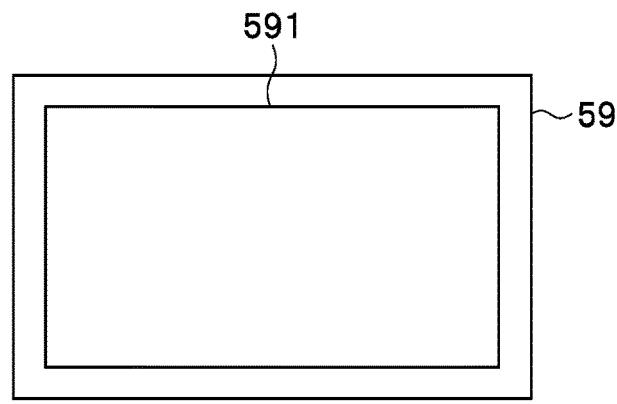

FIG. 5C shows the patterned surface of the ninth dielectric layer 59. A conductor layer 591 is formed on the patterned surface of the dielectric layer 59. The through hole 58T8 formed in the dielectric layer 58 is connected to the conductor layer 591.

The stack 50 shown in FIG. 2 is formed by stacking the first to ninth dielectric layers 51 to 59 such that the patterned surface of the first dielectric layer 51 serves as the first surface 50A of the stack 50 and the surface of the ninth dielectric layer 59 opposite to the patterned surface thereof serves as the second surface 50B of the stack 50.

Figure 6:
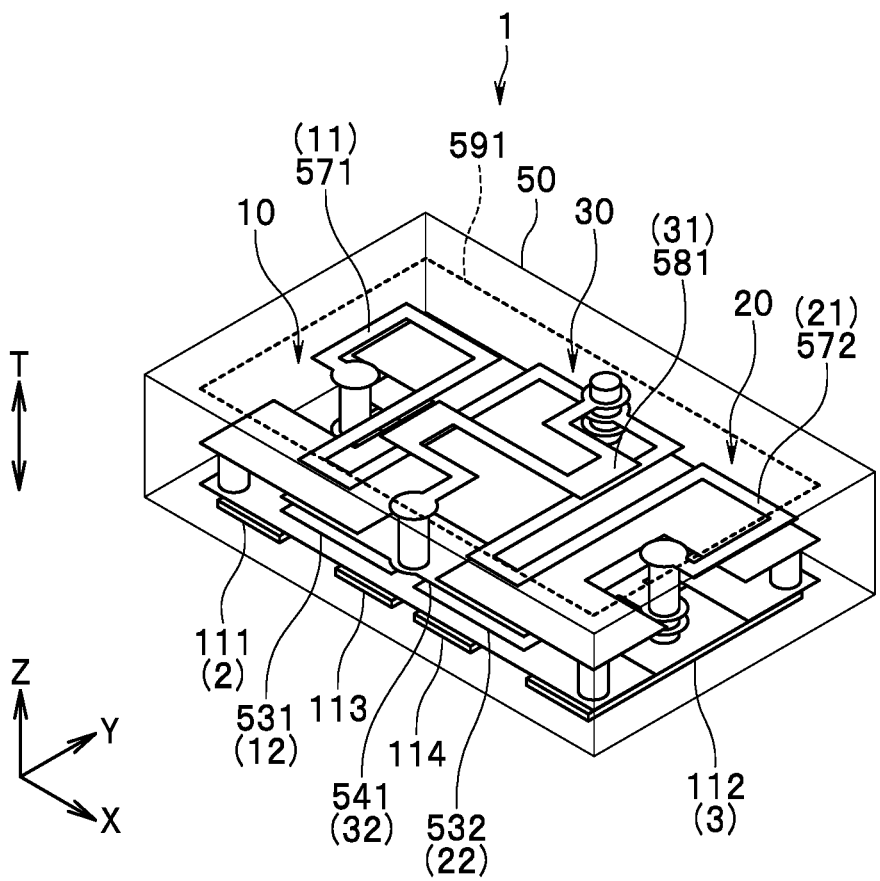
FIG. 6 is perspective view showing an inside of the stack of the multilayered filter device according to the first embodiment of the present invention.

FIG. 6 shows the inside of the stack 50 formed by stacking the first to ninth dielectric layers 51 to 59. As shown in FIG. 6, the plurality of conductor layers and the plurality of through holes shown in FIG. 3A to 5C are stacked inside the stack 50.

Correspondences between the circuit components of the filter device 1 shown in FIG. 1 and the internal components of the stack 50 shown in FIG. 3A to FIG. 5C will now be described. First, the first resonator 10 will be described. The first line part 11 is formed of the conductor layer 571. The second line part 12 is formed of the conductor layer 531. The conductor part 13 is formed of the conductor layer 532.

The conductor layer 532 (conductor part 13) and the through holes 53T1, 54T1, 55T1, and 56T1 connect the conductor layer 571 forming the first line part 11 and the conductor layer 531 forming the second line part 12. The conductor layer 571 forming the first line part 11 is connected to the ground terminals 113 to 116 via the through holes 51T3 to 51T6, the conductor layer 521, the through holes 52T3 to 52T6 and 53T3 to 53T6, the through holes 54T3 to 54T6, the conductor layer 551, and the through holes 55T8 and 56T8.

Next, the second resonator 20 will be described. The first line part 21 is formed of the conductor layer 572. The second line part 22 is formed of the conductor layer 533. The conductor part 23 is formed of the conductor layer 534.

The conductor layer 534 (conductor part 23) and the through holes 53T2, 54T2, 55T2, and 56T2 connect the conductor layer 572 forming the first line part 21 and the conductor layer 533 forming the second line part 22. The conductor layer 572 forming the first line part 21 is connected to the ground terminals 113 to 116 via the through holes 51T3 to 51T6, the conductor layer 521, the through holes 52T3 to 52T6 and 53T3 to 53T6, the through holes 54T3 to 54T6, the conductor layer 551, and the through holes 55T8 and 56T8.

Next, the third resonator 30 will be described. The first line part 31 is formed of the conductor layer 581. The second line part 32 is formed of the conductor layer 541.

The conductor layer 581 forming the first line part 31 is connected to the ground terminals 113 to 116 via the through holes 51T3 to 51T6, the conductor layer 521, the through holes 52T3 to 52T6 and 53T3 to 53T6, the through holes 54T3 to 54T6, the conductor layer 551, and the through holes 55T8, 56T8, and 57T8.

Next, the conductor portions 4 and 5 will be described. The conductor portion 4 is formed of the through holes 51T1 and 52T1. The through hole 51T1 is connected to the first terminal 111. The through hole 52T1 is connected to the conductor layer 532 forming the conductor part 13 and is also connected to the conductor layer 571 forming the first line part 11 via the through holes 53T1, 54T1, 55T1, and 56T1.

The conductor portion 5 is formed of the through holes 51T2 and 52T2. The through hole 51T2 is connected to the second terminal 112. The through hole 52T2 is connected to the conductor layer 534 forming the conductor part 23 and is also connected to the conductor layer 572 forming the first line part 21 via the through holes 53T2, 54T2, 55T2, and 56T2.

Figure 7:
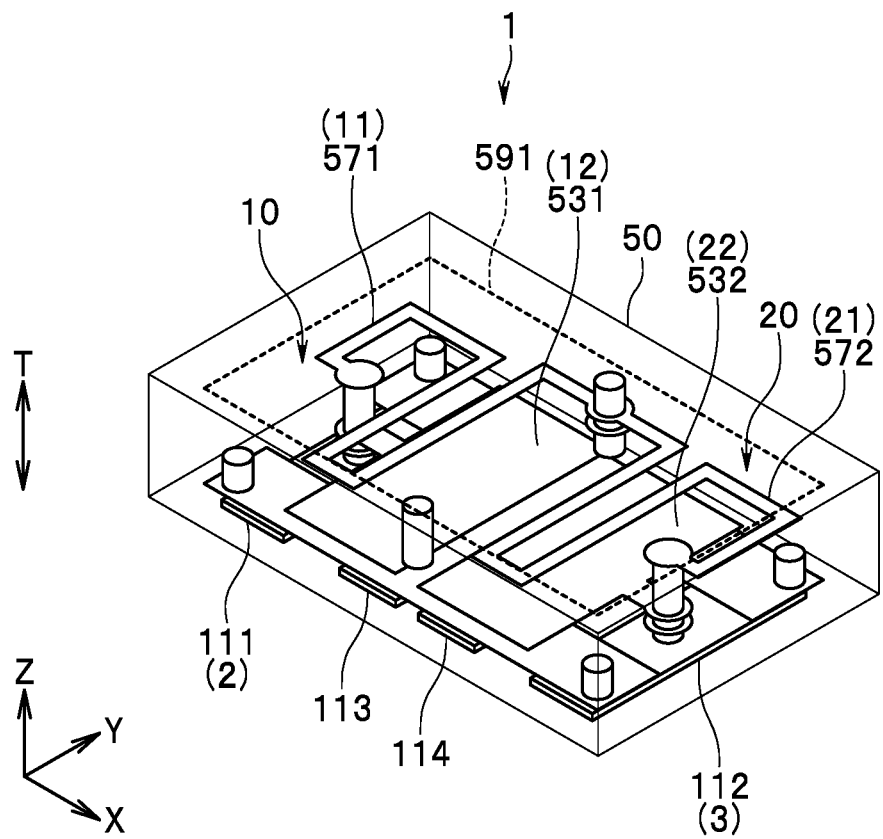
FIG. 7 is a perspective view showing part of the inside of the stack of the multilayered filter device according to the first embodiment of the present invention.
Figure 8:
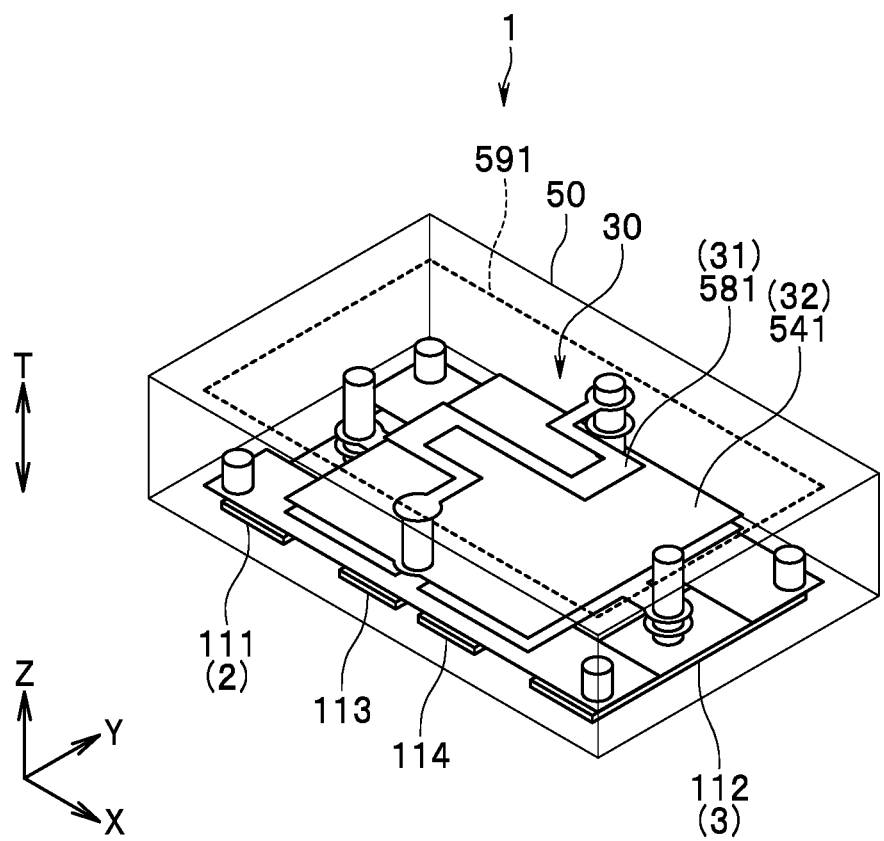
FIG. 8 is a perspective view showing part of the inside of the stack of the multilayered filter device according to the first embodiment of the present invention.

Next, the structural features of the filter device 1 according to the present embodiment will be described with reference to FIG. 2 to FIG. 8. FIG. 7 and FIG. 8 are each a perspective view showing part of an inside of the stack 50. FIG. 7 mainly shows a plurality of conductor layers and a plurality of through holes forming the first and second resonators 10 and 20. FIG. 8 mainly shows a plurality of conductor layers and a plurality of through holes forming the third resonator 30.

The first resonator 10 is arranged in an area on the —X direction side in the stack 50. In other words, the first resonator 10 is arranged at a position closer to the side surface 50C than the side surface 50D. As shown in FIG. 7, the first line part 11 (conductor layer 571) and the second line part 12 (conductor layer 531) of the first resonator 10 are arranged at positions different from each other in the stacking direction T. The second line part 12 is arranged between the first surface 50A, where the plurality of terminals 111 to 116 are arranged, and the first line part 11.

The first line part 11 (conductor layer 571) includes a plurality of portions extending in a plurality of directions that are orthogonal to the stacking direction T. In particular, in the present embodiment, the first line part 11 (conductor layer 571) includes four portions each extending in a direction parallel to the X direction and three portions each extending in a direction parallel to the Y direction.

The shape of the second line part 12 (conductor layer 531) is long in a direction crossing the longitudinal direction of the stack 50. In particular, in the present embodiment, the shape of the second line part 12 (conductor layer 531) is a rectangular shape that is long in a direction parallel to the Y direction.

The second resonator 20 is arranged in an area on the X direction side in the stack 50. In other words, the second resonator 20 is arranged at a position closer to the side surface 50D than the side surface 50C. As shown in FIG. 7, the first line part 21 (conductor layer 572) and the second line part 22 (conductor layer 533) of the second resonator 20 are arranged at positions different from each other in the stacking direction T. The second line part 22 is arranged between the first surface 50A, where the plurality of terminals 111 to 116 are arranged, and the first line part 21.

The first line part 21 (conductor layer 572) includes a plurality of portions extending in a plurality of directions that are orthogonal to the stacking direction T. In particular, in the present embodiment, the first line part 21 (conductor layer 572) includes four portions each extending in a direction parallel to the X direction and three portions each extending in a direction parallel to the Y direction.

The shape of the second line part 22 (conductor layer 533) is long in a direction crossing the longitudinal direction of the stack 50. In particular, in the present embodiment, the shape of the second line part 22 (conductor layer 533) is a rectangular shape that is long in a direction parallel to the Y direction.

At least part of the third resonator 30 is arranged between the first resonator 10 and the second resonator 20 when seen in the Z direction. In particular, in the present embodiment, part of the third resonator 30 is arranged between the first resonator 10 and the second resonator 20.

As shown in FIG. 8, the first line part 31 (conductor layer 581) and the second line part 32 (conductor layer 541) of the third resonator 30 are arranged at positions different from each other in the stacking direction T. The second line part 32 is arranged between the first surface 50A, where the plurality of terminals 111 to 116 are arranged, and the first line part 31.

The first line part 31 (conductor layer 581) includes a plurality of portions extending in a plurality of directions that are orthogonal to the stacking direction T. In particular, in the present embodiment, the first line part 31 (conductor layer 581) includes three portions each extending in a direction parallel to the X direction and four portions each extending in a direction parallel to the Y direction.

The first line part 31 (conductor layer 581) has an asymmetrical shape with respect to a given XZ plane crossing the first line part 31 and also has an asymmetrical shape with respect to a given YZ plane crossing the first line part 31. Hereinafter, the given XZ plane crossing the first line part 31 is referred to as a first virtual plane, and the given YZ plane crossing the first line part 31 is referred to as a second virtual plane. The first virtual plane may cross the center of the stack 50 in a direction parallel to the Y direction. The second virtual plane may cross the center of the stack 50 in a direction parallel to the X direction.

The shape of the second line part 32 (conductor layer 541) is long in the longitudinal direction of the stack 50. In particular, in the present embodiment, the shape of the second line part 32 (conductor layer 541) is a rectangular shape that is long in a direction parallel to the X direction.

As shown in FIG. 5A and FIG. 6, the first line part 11 (conductor layer 571) of the first resonator 10 and the first line part 21 (conductor layer 572) of the second resonator 20 are arranged at the same position in the stacking direction T. As shown in FIG. 5A, FIG. 5B, and FIG. 6, the first line part 31 (conductor layer 581) of the third resonator 30 is arranged at a position different from the positions of the first line parts 11 and 21 in the stacking direction T. Part of the first line part 11 and part of the first line part 21 overlap the first line part 31 when seen in the Z direction. The shape of the first line part 31 is different from the shape of the first line part 11 and the shape of the first line part 21.

As shown in FIG. 3C and FIG. 6, the second line part 12 (conductor layer 531) of the first resonator 10 and the second line part 22 (conductor layer 533) of the second resonator 20 are arranged at the same position in the stacking direction T. As shown in FIG. 3C, FIG. 4A, and FIG. 6, the second line part 32 (conductor layer 541) of the third resonator 30 is arranged at a position different from the positions of the second line parts 12 and 22 in the stacking direction T. Part of the second line part 12 and part of the second line part 22 overlap the second line part 32 when seen in the Z direction. The shape of the second line part 32 is different from the shape of the second line part 12 and the shape of the second line part 22.

As shown in FIG. 3C, FIG. 4A, FIG. 7, and FIG. 8, the shape of the second line part 32 of the third resonator 30 is long in a direction orthogonal to the stacking direction T, and the shape of each of the second line part 12 of the first resonator 10 and the second line part 22 of the second resonator 20 is long in a direction orthogonal to the stacking direction T and crossing the longitudinal direction of the second line part 32.

As described above, in particular, in the present embodiment, the shape of the second line part 12 and the shape of the second line part 22 are both rectangular shapes that are each long in a direction parallel to the Y direction, and the shape of the second line part 32 is a rectangular shape that is long in a direction parallel to the X direction. Hence, the longitudinal direction of the second line part 12 and the longitudinal direction of the second line part 22 are orthogonal to the longitudinal direction of the second line part 32 (direction parallel to the X direction).

As described above, in the present embodiment, the first line part 11 and the second line part 12 of the first resonator 10 are arranged at positions different from each other in the stacking direction T. Thus, according to the present embodiment, the first line part 11 and the second line part 12 can be arranged while overlapping each other. Hence, according to the present embodiment, the area for arranging the first resonator 10 can be made substantially smaller than that for a case where the first line part 11 and the second line part 12 are formed in the same dielectric layer to be arranged in the same position in the stacking direction T.

The description of the first resonator 10 above is also applicable to the second and third resonators 20 and 30. In view of these, according to the present embodiment, the filter device 1 can be miniaturized.

In the present embodiment, each of the first line parts 11, 21, and 31 includes the plurality of portions extending in the plurality of directions different from each other. Hence, according to the present embodiment, the area for arranging each of the first line parts 11, 21, and 31 can be made substantially smaller than that for a case where each of the first line parts 11, 21, and 31 extends in one direction.

In the present embodiment, the first line part 31 has an asymmetrical shape as described above. Thus, according to the present embodiment, the interaction to occur between the first line part 11 and the first line part 31 and the interaction to occur between the first line part 21 and the first line part 31 can be made different from each other. This can, for example, reduce generation of spurious in a frequency region higher than the passband.

In the present embodiment, the conductor layer 591 is connected to the ground terminals 113 to 116 via the through holes 51T3 to 51T6, the conductor layer 521, the through holes 52T3 to 52T6 and 53T3 to 53T6, the through holes 54T3 to 54T6, the conductor layer 551, and the through holes 55T8, 56T8, 57T8, and 58T8. The first to third resonators 10, 20, and 30 are arranged between the conductor layer 521 and the conductor layer 591. Each of the conductor layers 521 and 591 overlap the first to third resonators 10, 20, and 30 when seen in the Z direction. The conductor layers 521 and 591 function as shields.

In the present embodiment, the shape of each of the second line part 12 of the first resonator 10 and the second line part 22 of the second resonator 20 is long in a direction crossing the longitudinal direction of the second line part 32 of the third resonator 30. Thus, according to the present invention, it is possible to reduce generation of spurious. This effect will be described below with reference to results of a simulation.

First, a model of a comparative example and models of first and second practical examples used in the simulation will be described. The model of the comparative example is a model of a filter device of the comparative example. A configuration of the filter device of the comparative example is almost the same as the configuration of the filter device 1 according to the present embodiment except for the shapes of the second line part 12 of the first resonator 10 and the second line part 22 of the second resonator 20. In the filter device of the comparative example, each of the second line parts 12 and 22, similarly to the second line part 32 of the third resonator 30, has a rectangular shape that is long in a direction parallel to the X direction. In the model of the comparative example, the impedance ratio in each of the first and second resonators 10 and 20 was set to 0.106, and the impedance ratio in the third resonator 30 was set to 0.094.

The model of the first practical example is a model of a filter device of the first practical example. A configuration of the filter device of the first practical example is almost the same as the configuration of the filter device 1 according to the present embodiment except for the shapes of the second line part 12 of the first resonator 10 and the second line part 22 of the second resonator 20. In the filter device of the first practical example, the shape of each of the second line parts 12 and 22 is long in a direction crossing the longitudinal direction of the plane shape of the stack 50, i.e., a direction parallel to the X direction. The second line part 12 extends in a direction parallel to a direction rotated by 115° clockwise from the Y direction toward the —Y direction (direction rotated by 25° from the X direction toward the —Y direction) when the second line part 12 is seen from a position located ahead of the Z direction. The second line part 22 extends in a direction parallel to a direction rotated by 115° counterclockwise from the Y direction toward the –Y direction (direction rotated by 25° from the –X direction toward the –Y direction) when the second line part 22 is seen from a position located ahead of the Z direction. In the model of the first practical example, the impedance ratio in each of the first and second resonators 10 and 20 was set to 0.106, and the impedance ratio in the third resonator 30 was set to 0.094.

The model of the second practical example is a model of the filter device 1 according to the present embodiment. In the model of the second practical example, the impedance ratio in each of the first and second resonators 10 and 20 was set to 0.106, and the impedance ratio in the third resonator 30 was set to 0.094.

In the simulation, each of the model of the comparative example and the models of first and second practical examples was designed to function as a band-pass filter. The pass attenuation characteristics of each of the model of the comparative example and the models of first and second practical examples were determined.

Figure 9:
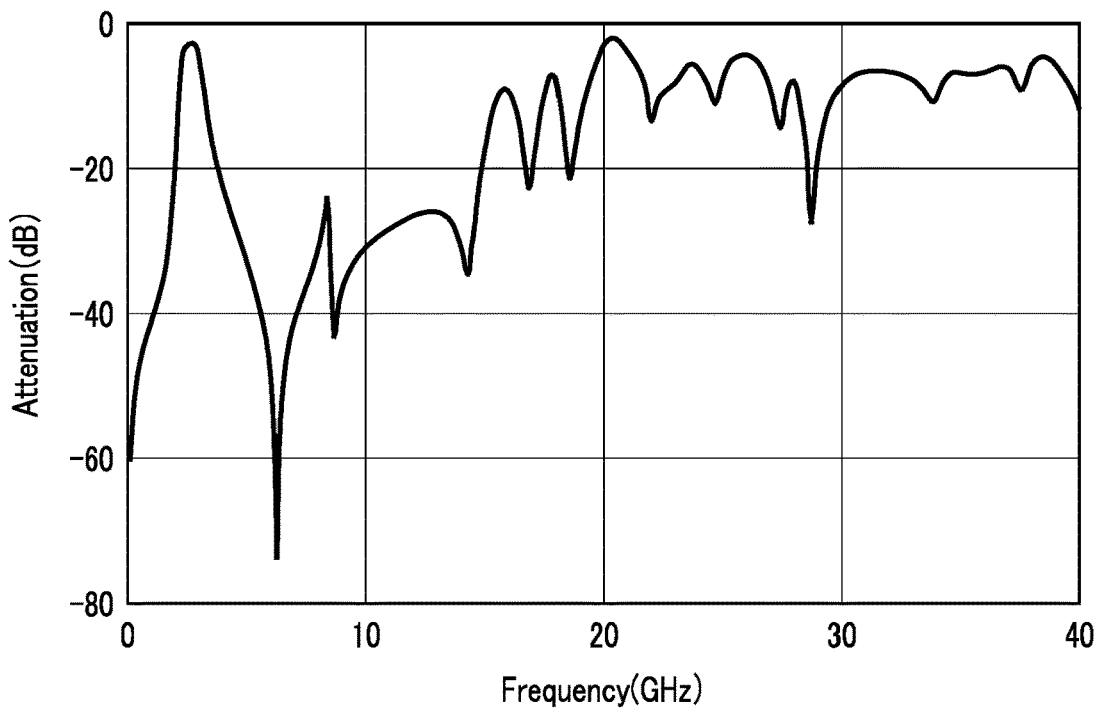
FIG. 9 is a characteristic chart showing pass attenuation characteristics of a model according to a comparative example.

FIG. 9 is a characteristic chart showing pass attenuation characteristics of the model of the comparative example. In FIG. 9, the horizontal axis represents frequency, and the vertical axis represents attenuation. As illustrated in FIG. 9, in the model of the comparative example, many spurious components are generated in a frequency region (for example, a region having frequencies of 15 GHz to 40 GHz) higher than a passband, which consequently reduced the absolute value of attenuation in this frequency region.

Figure 10:
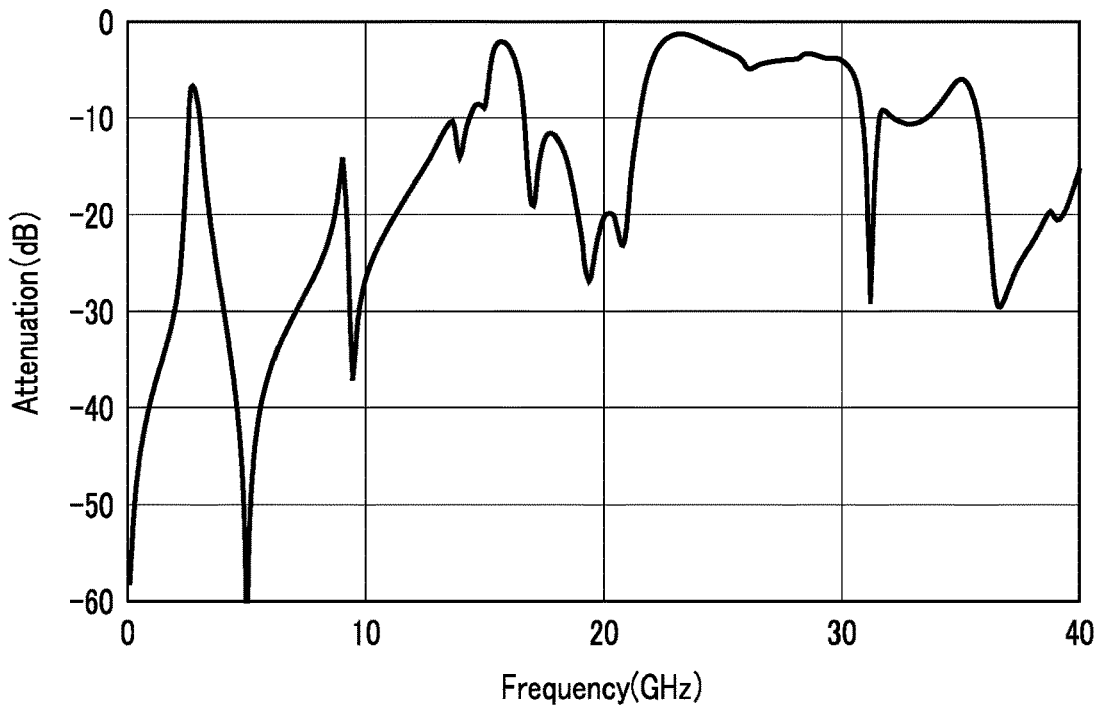
FIG. 10 is a characteristic chart showing pass attenuation characteristics of a model according to a first practical example.

FIG. 10 is a characteristic chart showing pass attenuation characteristics of the model of the first practical example. In FIG. 10, the horizontal axis represents frequency, and the vertical axis represents attenuation. As illustrated in FIG. 10, in the model of the first practical example, the number of spurious components was reduced compared to that of the model of the comparative example, and a frequency region where the absolute value of attenuation was large (for example, a frequency region in which the absolute value of attenuation is 10 dB or larger) was expanded in a frequency region (for example, a region having frequencies of 15 GHz to 40 GHz) higher than a passband.

Figure 11:
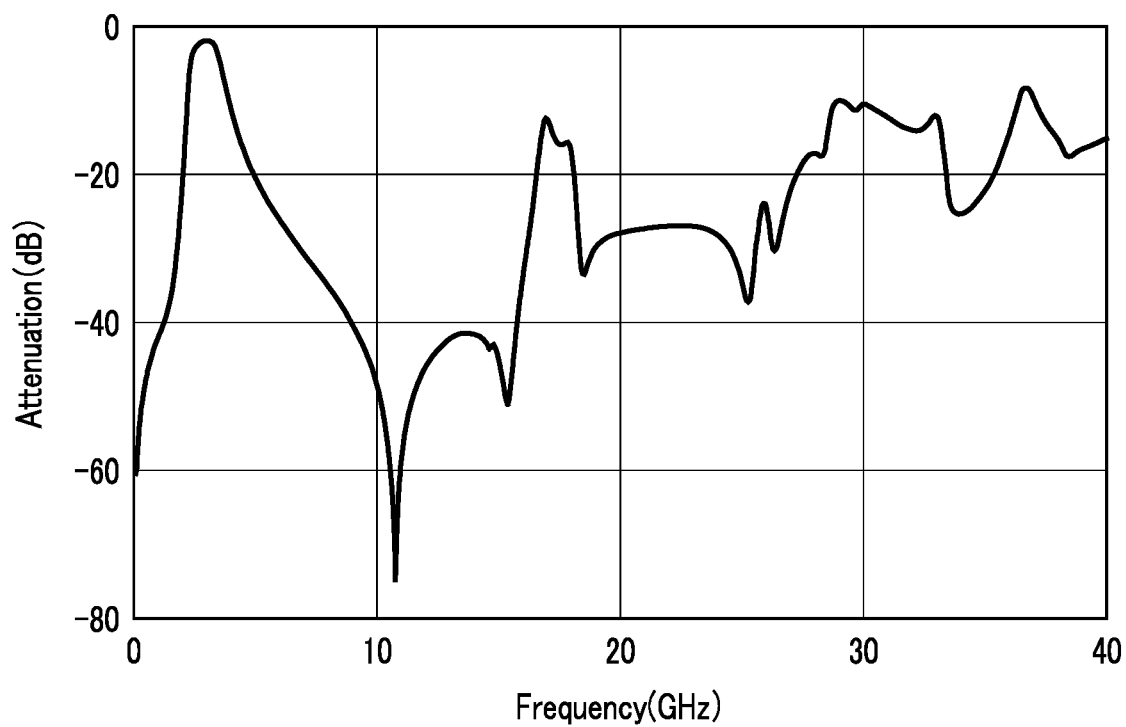
FIG. 11 is a characteristic chart showing pass attenuation characteristics of a model according to a second practical example.

FIG. 11 is a characteristic chart showing pass attenuation characteristics of the model of the second practical example. In FIG. 11, the horizontal axis represents frequency, and the vertical axis represents attenuation. As illustrated in FIG. 11, in the model of the second practical example, the number of spurious components was reduced compared to those of the model of the comparative example and the model of the first practical example, which consequently increased the absolute value of attenuation in the frequency region higher than the passband.

The reasons why the number of spurious components was reduced in the model of the second practical example are considered as follows. In the model of the comparative example, each of the longitudinal direction of the second line part 12 of the first resonator 10 and the longitudinal direction of the second line part 22 of the second resonator 20 coincides with the longitudinal direction of the second line part 32 of the third resonator 30. It is considered that this configuration increased the interaction between the second line part 12 and the second line part 32 and the interaction between the second line part 22 and the second line part 32, and consequently spurious was generated.

In contrast to this, in the model of the second practical example, the longitudinal direction of each of the second line parts 12 and 22 is made orthogonal to the longitudinal direction of the second line part 32, to change the above-described interactions. It is considered that this configuration reduced the number of spurious components in the model of the second practical example.

Note that, as described above, in the model of the first practical example, the frequency region where the absolute value of attenuation was large was expanded compared to that in the model of the comparative example. The simulation results indicate that, by changing the above-described interactions, spurious can be reduced also in a case other than a case where the longitudinal direction of each of the second line parts 12 and 22 is made orthogonal to the longitudinal direction of the second line part 32. Hence, it is possible to reduce spurious also when the longitudinal direction of each of the second line parts 12 and 22 is made to cross the longitudinal direction of the second line part 32 at an angle other than 90°.

Second Embodiment

Figure 12:
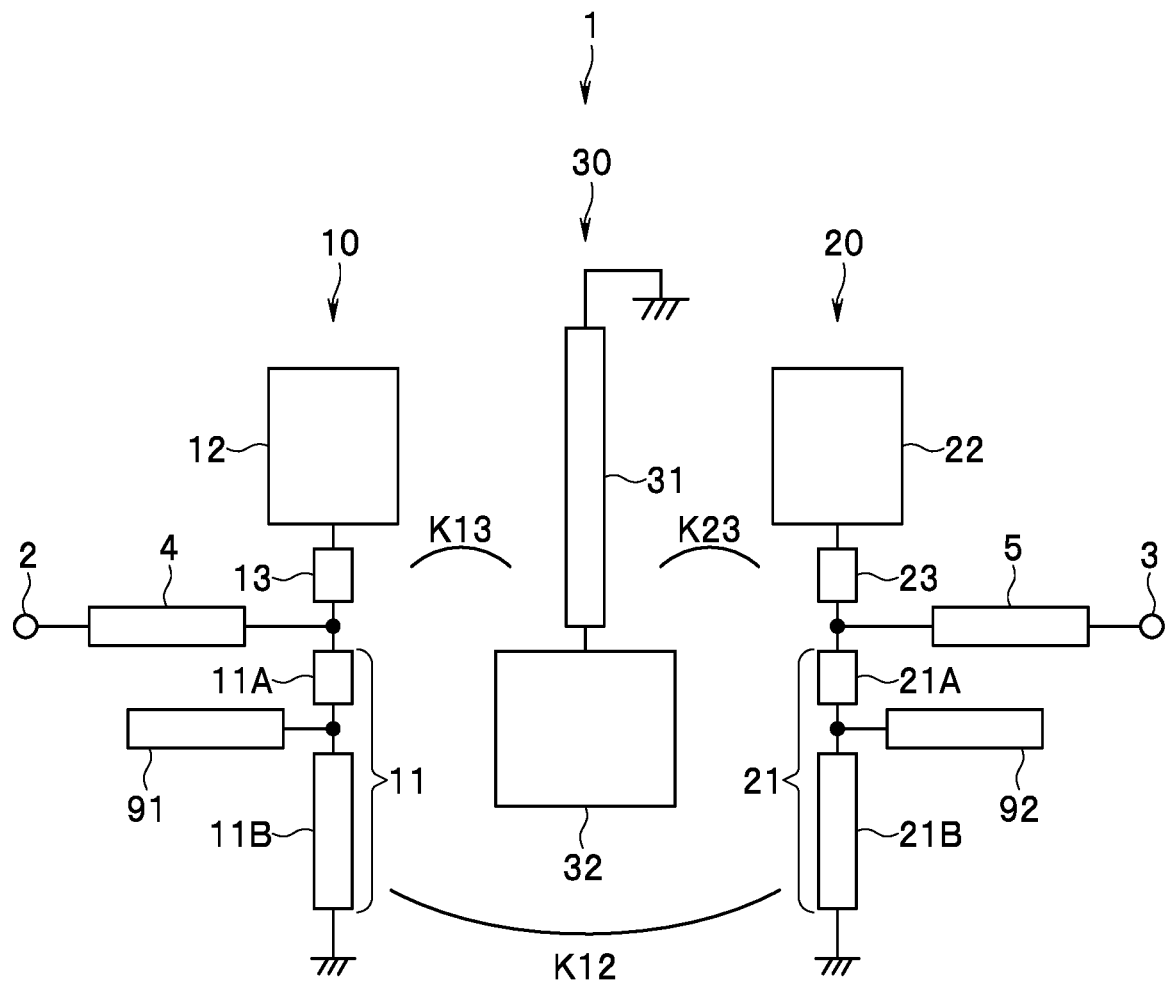
FIG. 12 is a circuit diagram showing a circuit configuration of a multilayered filter device according to a second embodiment of the present invention.
Figure 13:
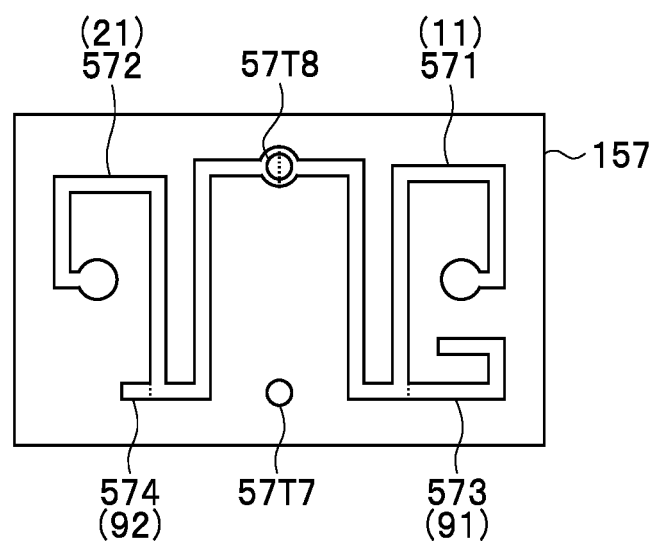
FIG. 13 is an explanatory diagram showing a patterned surface of a seventh dielectric layer of a stack of the multilayered filter device according to the second embodiment of the present invention.
Figure 14:
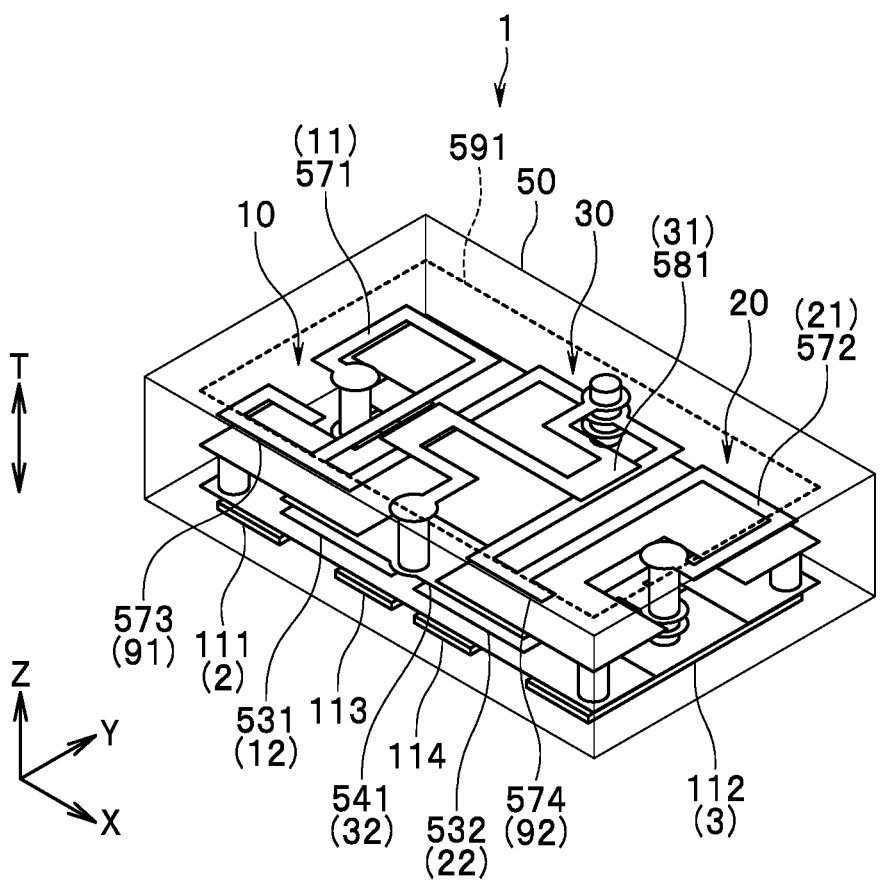
FIG. 14 is a perspective view showing an inside of the stack of the multilayered filter device according to the second embodiment of the present invention.

A description of a second embodiment of the present invention will be given with reference to FIGS. 12 to 14. FIG. 12 is a circuit diagram showing a circuit configuration of the multilayered filter device according to the present embodiment. FIG. 13 is an explanatory diagram showing a patterned surface of a seventh dielectric layer according to the present embodiment. FIG. 14 is a perspective view showing an inside of a stack of the multilayered filter device according to the present embodiment.

A filter device 1 according to the present embodiment differs from that of the first embodiment in the following respects. The filter device 1 according to the present embodiment includes a first stub resonator 91 electrically connected to the first line part 11 of the first resonator 10, and a second stub resonator 92 electrically connected to the first line part 21 of the second resonator 20. Each of the first and second stub resonators 91 and 92 is a distributed constant line.

The first stub resonator 91 is connected in the middle of the first line part 11. In FIG. 12, for the first line part 11, a portion located between a connecting point with the first stub resonator 91 and the second line part 12 in the circuit configuration is indicated by a reference numeral 11A, and a portion located between a connecting point with the first stub resonator 91 and the ground in the circuit configuration is indicated by a reference numeral 11B.

The second stub resonator 92 is connected in the middle of the first line part 21. In FIG. 12, for the first line part 21, a portion located between a connecting point with the second stub resonator 92 and the second line part 22 in the circuit configuration is indicated by a reference numeral 21A, and a portion located between a connecting point with the second stub resonator 92 and the ground in the circuit configuration is indicated by a reference numeral 21B.

In the present embodiment, the stack 50 includes a dielectric layer 157 shown in FIG. 13 instead of the seventh dielectric layer 57 in the first embodiment. Similarly to the dielectric layer 57, conductor layers 571 and 572 are formed on a patterned surface of the dielectric layer 157. Conductor layers 573 and 574 are further formed on the patterned surface of the dielectric layer 157. The conductor layer 573 is connected in the middle of the conductor layer 571. The conductor layer 574 is connected in the middle of the conductor layer 572. In FIG. 13, each of the boundary between the conductor layer 571 and the conductor layer 573 and the boundary between the conductor layer 572 and the conductor layer 574 is indicated by a dotted line.

The first stub resonator 91 is constituted of the conductor layer 572. The second stub resonator 92 is constituted of the conductor layer 574. The shape of the conductor layer 572 and the shape of the conductor layer 574 may be the same or different from each other. In the example shown in FIG. 13, the shape of the conductor layer 572 and the shape of the conductor layer 574 are different from each other.

The first and second stub resonators 91 and 92 are used, for example, to control generation of spurious in a frequency region higher than a passband. Each of the first and second stub resonators 91 and 92 may be an open stub with one end being open or may be a short stub with one end being connected to ground.

The configuration, operation, and effects of the present embodiment are otherwise the same as those of the first embodiment.

Third Embodiment

Figure 15:
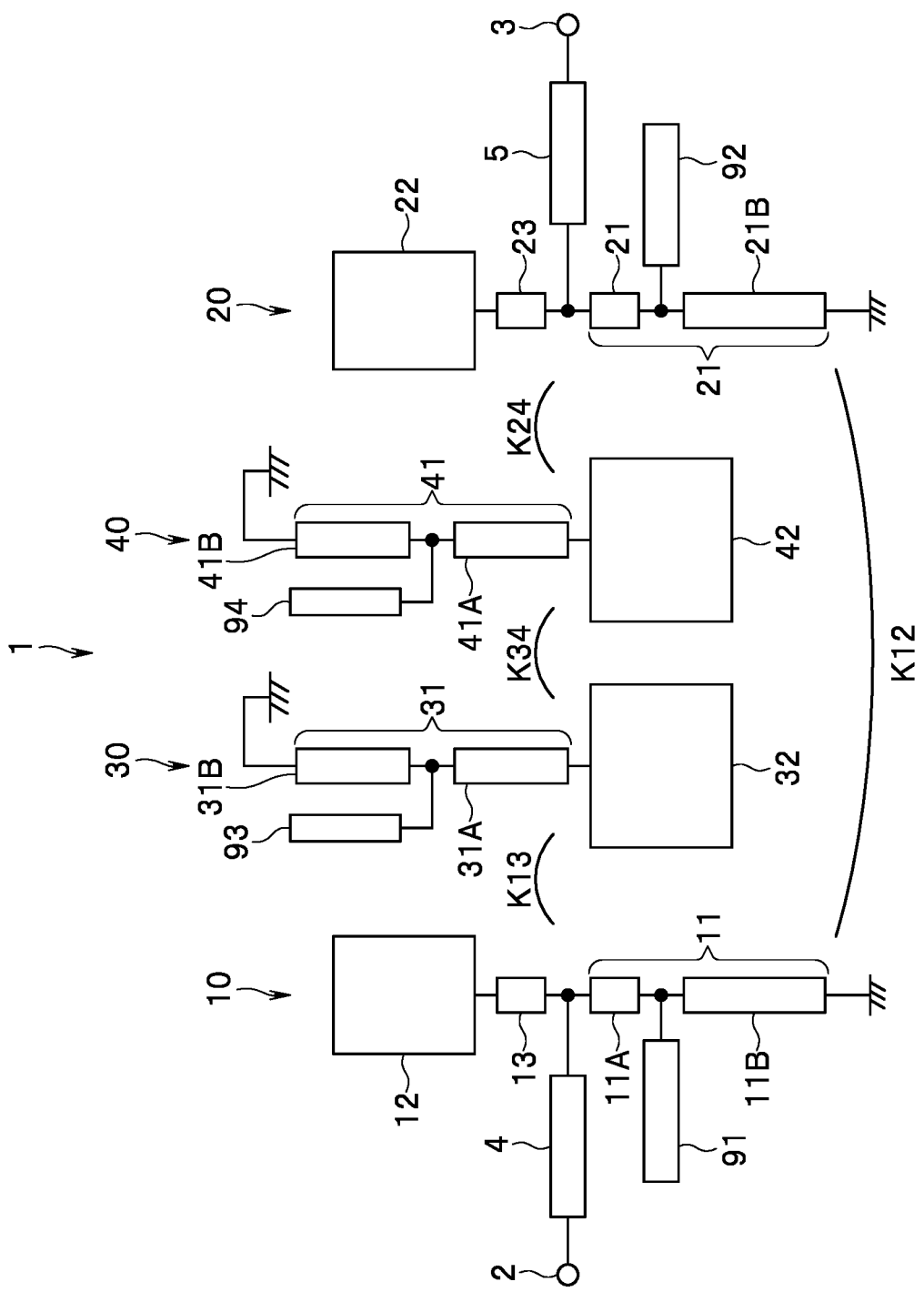
FIG. 15 is a circuit diagram showing a circuit configuration of a multilayered filter device according to a third embodiment of the present invention.

Next, a description of a third embodiment of the present invention will be given with reference to FIG. 15. FIG. 15 is a circuit diagram showing a circuit configuration of a multilayered filter device according to the present embodiment.

A filter device 1 according to the present embodiment differs from that of the second embodiment in the following respects. The filter device 1 according to the present embodiment includes a fourth resonator 40. The fourth resonator 40 is arranged between the second resonator 20 and the third resonator 30 in the circuit configuration. In the present embodiment, the first to fourth resonators 10, 20, 30, and 40 are configured so that the first resonator 10 and the third resonator 30 are adjacent to each other in the circuit configuration to be electromagnetically coupled to each other, the third resonator 30 and the fourth resonator 40 are adjacent to each other in the circuit configuration to be electromagnetically coupled to each other, and the second resonator 20 and the fourth resonator 40 are adjacent to each other in the circuit configuration to be electromagnetically coupled to each other. In FIG. 15, a curve with a sign K13 represents an electric field coupling between the first resonator 10 and the third resonator 30, a curve with a sign K34 represents a magnetic field coupling between the third resonator 30 and the fourth resonator 40, and a curve with a sign K24 represents an electric field coupling between the second resonator 20 and the fourth resonator 40.

A configuration of the fourth resonator 40 is basically the same as the configuration of the third resonator 30. Specifically, the fourth resonator 40 includes a first line part 41 and a second line part 42 having an impedance smaller than that of the first line part 41. The first line part 41 and the second line part 42 are electrically connected to each other. The first line part 41 is connected to ground. Each of the first line part 41 and the second line part 42 is a distributed constant line. In particular, in the present embodiment, the first line part 41 is a distributed constant line having a small width, and the second line part 42 is a distributed constant line having a width larger than that of the first line part 41.

The fourth resonator 40, similarly to the first to third resonators 10, 20, and 30, is a stepped-impedance resonator composed of a distributed constant line having a small width and a distributed constant line having a large width.

Although not shown, the first line part 41 and the second line part 42 of the fourth resonator 40, similarly to the first line part 31 and the second line part 32 of the third resonator 30, are arranged at positions different from each other in the stacking direction T. The first line part 31 and the first line part 41 may be arranged at the same position in the stacking direction T or may be arranged at positions different from each other in the stacking direction T. Similarly, the second line part 32 and the second line part 42 may be arranged at the same position in the stacking direction T or may be arranged at positions different from each other in the stacking direction T.

In the present embodiment, at least part of the third resonator 30 and at least part of the fourth resonator 40 are arranged between the first resonator 10 and the second resonator 20 when seen in the Z direction (refer to FIG. 2).

In the present embodiment, part of the first line part 11 of the first resonator 10 may overlap the first line part 31 of the third resonator 30 when seen in the Z direction. In this case, part of the first line part 21 of the second resonator 20 may overlap the first line part 41 of the fourth resonator 40 when seen in the Z direction.

In the present embodiment, part of the second line part 12 of the first resonator 10 may overlap the second line part 32 of the third resonator 30 when seen in the Z direction. In this case, part of the second line part 22 of the second resonator 20 may overlap the second line part 42 of the fourth resonator 40 when seen in the Z direction.

The filter device 1 according to the present embodiment further includes a third stub resonator 93 electrically connected to the first line part 31 of the third resonator 30, and a fourth stub resonator 94 electrically connected to the first line part 41 of the fourth resonator 40. Each of the third and fourth stub resonators 93 and 94 is a distributed constant line.

The third stub resonator 93 is connected in the middle of the first line part 31. In FIG. 15, for the first line part 31, a portion located between a connecting point with the third stub resonator 93 and the second line part 32 in the circuit configuration is indicated by a reference numeral 31A, and a portion located between a connecting point with the third stub resonator 93 and the ground in the circuit configuration is indicated by a reference numeral 31B.

The fourth stub resonator 94 is connected in the middle of the first line part 41. In FIG. 15, for the first line part 41, a portion located between a connecting point with the fourth stub resonator 94 and the second line part 42 in the circuit configuration is indicated by a reference numeral 41A, and a portion located between a connecting point with the fourth stub resonator 94 and the ground in the circuit configuration is indicated by a reference numeral 41B.

The third and fourth stub resonators 93 and 94 are used, for example, to control spurious to be generated in a frequency region higher than a passband. Each of the third and fourth stub resonators 93 and 94 may be an open stub with one end being open or may be a short stub with one end being connected to ground.

The configuration, operation, and effects of the present embodiment are otherwise the same as those of the second embodiment.

The present invention is not limited to the foregoing embodiments, and various modifications may be made thereto. For example, the number and configuration of resonators are not limited to those shown in the embodiments, and any number and configuration of resonators may be employed as long as the scope of the claims is satisfied. The number of resonators may be one, two, or five or more.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:
1. A multilayered filter device comprising:
   a stack including a plurality of dielectric layers stacked together; and
   a first resonator, a second resonator, and a third resonator integrated with the stack, wherein
   the stack includes a first side surface and a second side surface located at both ends in a direction orthogonal to a stacking direction of the plurality of dielectric layers,
   the first resonator is arranged at a position closer to the first side surface than the second side surface, the second resonator is arranged at a position closer to the second side surface than the first side surface, at least part of the third resonator is arranged between the first resonator and the second resonator when seen in a direction parallel to the stacking direction, each of the first resonator, the second resonator, and the third resonator includes a first line part and a second line part having an impedance smaller than an impedance of the first line part, an impedance ratio being a ratio of the impedance of the second line part to the impedance of the first line part in at least one of the first resonator, the second resonator, and the third resonator is 0.3 or smaller, a shape of the second line part of the third resonator is long in a direction orthogonal to the stacking direction, a shape of each of the second line part of the first resonator and the second line part of the second resonator is long in a direction orthogonal to the stacking direction and crossing a longitudinal direction of the second line part of the third resonator, the first line part of the first resonator and the second line part of the first resonator are located at positions different from each other in the stacking direction and electrically connected to each other, the first line part of the second resonator and the second line part of the second resonator are located at positions different from each other in the stacking direction and electrically connected to each other, and the first line part of the third resonator and the second line part of the third resonator are located at positions different from each other in the stacking direction and electrically connected to each other.

2. The multilayered filter device according to claim 1, wherein the impedance ratio in each of the first resonator, the second resonator, and the third resonator is 0.3 or smaller.

3. The multilayered filter device according to claim 1, wherein a longitudinal direction of the second line part of the first resonator and a longitudinal direction of the second line part of the second resonator are orthogonal to the longitudinal direction of the second line part of the third resonator.

4. The multilayered filter device according to claim 1, wherein each of the first line part of the first resonator and the first line part of the second resonator includes portions extending in a plurality of directions that are orthogonal to the stacking direction and are different from each other.

5. The multilayered filter device according to claim 1, wherein the first line part of the third resonator has an asymmetrical shape.

6. The multilayered filter device according to claim 1, further comprising:
   a first stub resonator electrically connected to the first line part of the first resonator; and
   a second stub resonator electrically connected to the first line part of the second resonator.

7. The multilayered filter device according to claim 1, wherein the third resonator is arranged between the first resonator and the second resonator in a circuit configuration.

8. The multilayered filter device according to claim 1, wherein
   the second line part of the first resonator and the second line part of the second resonator are arranged at a same position in the stacking direction, and
   the second line part of the third resonator is arranged at a position different from a position of the second line part of each of the first resonator and the second resonator in the stacking direction.

9. The multilayered filter device according to claim 1, further comprising a plurality of through holes connecting the first line part and the second line part of each of the first resonator, the second resonator, and the third resonator.

10. The multilayered filter device according to claim 1, wherein
   the first line part of the first resonator and the first line part of the second resonator are arranged at a same position in the stacking direction, and
   the first line part of the third resonator is arranged at a position different from a position of the first line part of each of the first resonator and the second resonator in the stacking direction.

* * * * *